United States Patent
Saitoh

(10) Patent No.: US 8,450,797 B2
(45) Date of Patent: May 28, 2013

(54) SEMICONDUCTOR DEVICE AND METHOD OF MANUFACTURING THE SEMICONDUCTOR DEVICE

(75) Inventor: Naoto Saitoh, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/225,840

(22) Filed: Sep. 6, 2011

(65) Prior Publication Data

US 2012/0074490 A1    Mar. 29, 2012

(30) Foreign Application Priority Data

Sep. 24, 2010    (JP) ................................. 2010-214467

(51) Int. Cl.
*H01L 29/76*      (2006.01)
*H01L 31/062*    (2012.01)

(52) U.S. Cl.
USPC ............ 257/330; 257/329; 257/332; 257/341

(58) Field of Classification Search
USPC ................. 257/329–330, 332, 341, E29.262, 257/E21.41; 438/270
See application file for complete search history.

(56) References Cited

U.S. PATENT DOCUMENTS 6,084,264 A        7/2000   Darwish
2001/0028085 A1*  10/2001   Blanchard ..................... 257/330

FOREIGN PATENT DOCUMENTS

JP    2000-164869 A   6/2000

* cited by examiner

*Primary Examiner* — Theresa T Doan
(74) *Attorney, Agent, or Firm* — Brinks Hofer Gilson & Lione

(57) ABSTRACT

To realize forming a trench MOSFET in which a depth of a P-body is changed on the same surface as a CMOS by employing steps with good controllability and without greatly increasing the number of manufacturing steps, provided is a trench MOSFET including an extended body region (10), which is a part of a P-body region (4) and is provided in a vicinity of a deep trench (5) with a distance, the extended body region (10) being diffused deeper than the P-body region (4).

2 Claims, 5 Drawing Sheets

SEMICONDUCTOR DEVICE AND METHOD OF MANUFACTURING THE SEMICONDUCTOR DEVICE

RELATED APPLICATIONS

This application claims priority under 35 U.S.C. §119 to Japanese Patent Application No. 2010-214467 filed on Sep. 24, 2010, the entire content of which is hereby incorporated by reference

BACKGROUND OF THE INVENTION

1. Field of the Invention

The present invention relates to a semiconductor device and a method of manufacturing the semiconductor device. More particularly, the present invention relates to a structure and a manufacturing method of a metal-oxide-silicon field-effect transistor having a trench gate (trench MOSFET) formed on the same substrate with MOS transistors.

2. Description of the Related Art

MOS transistors are electronic devices playing a central role in electronics. Reducing the size of the MOS transistors and improving the driving performance thereof have been important challenges regardless in a low withstanding voltage region or in a high withstanding voltage region.

Since a transistor having a large channel width in a small area can be formed in a vertical trench MOSFET, in which vertical movement of carriers are generated, the vertical trench MOSFET is generally used in an application in which high driving performance is needed. Vertical trench MOSFETs have been widely used as discrete driver elements until now, but in recent years there has been proposed a manufacturing process of integration of the trench MOSFET having high driving performance with CMOS transistors forming a control circuit.

In many cases, the trench MOSFET has a vertical double diffused MOS (DMOS) structure, in which a region generally called a P-body has a portion which is held in contact with the gate oxide film and which works as a channel forming region. The concentration of the P-body region is set higher than that of a region of the adjacent drain having a relatively low impurity concentration. In this case, when a high voltage is applied to the drain, more extension of the depletion layer is generated in the drain than in the P-body, permitting suppression of lowering in breakdown voltage caused by a punch-through, in which the depletion layer extending from the drain reaches the source region. Accordingly the breakdown voltage can be ensured even when the channel length of the transistor is made short. Consequently there is a feature that an element having high driving performance can be easily obtained.

However, the resistance increases in inverse proportion to the impurity concentration in the region of the drain having a relatively low impurity concentration, and hence in consideration of the junction breakdown voltage, the impurity concentration thereof is desired to be set high to some extent. When the concentration of the P-body at this time is not changed, the depletion layer greatly expands to the P-body region side, causing reduction in punch-through breakdown voltage. On the other hand, when the impurity concentration of the P-body is increased in response to the drain impurity concentration, the increase may cause reduction in junction breakdown voltage and rise of a threshold voltage.

Conventionally, in order to maintain the breakdown voltage and suppress a drain parasitic resistance as much as possible, the following methods have been employed. That is, the impurity concentration of the P-body region and the concentration of the drain are adjusted, or alternatively, as described in Japanese Published Patent Application No. 2000-164869, a mask alignment/exposure step and an impurity implantation step are added to an epitaxial (Epi) step. In this manner, reduction in punch-through breakdown voltage due to the expansion of the depletion layer in the P-body region is suppressed.

In the technology described in Japanese Published Patent Application No. 2000-164869, as illustrated in FIG. 5, a trench MOSFET 30 is formed in a structure including a P type epitaxial layer 34 corresponding to an upper layer of an N+ type substrate 32. (Here, notation of N+ represents a heavily doped N type region.) An N type drain region 33 is formed by implantation into the P type epitaxial layer through a bottom portion of a trench 35, and then the N type drain region 33 is subjected to a diffusion step. In this manner, the N type drain region 33 is formed to extend between the N+ type substrate 32 and the bottom portion of the trench. A junction portion 33a between the N type drain region and the P type epitaxial layer 34 extends between the N+ type substrate and a side wall of the trench.

As described above, in this technology, the N type drain region 33 is formed by implantation into the P type epitaxial layer at the bottom portion of the trench 35, and hence the P-body region is formed shallow in the vicinity of the side wall of the trench, and is formed deep in a region distanced from the trench. In this manner, while controlling the channel length to be short to some extent, the punch-through breakdown voltage, at which the depletion layer reaches to the source side from the drain, is improved. This is because the depletion layer extending from the drain has a maximum extension in a region at some distance from the channel. In order to improve the breakdown voltage, it is effective to control the depletion layer in the region at some distance from the channel region just below the gate.

However, in the technology described in Japanese Published Patent Application No. 2000-164869, in order to change the depth of the P-body in the vicinity of the trench side wall, which determines the channel length, and the depth of the P-body in a region at some distance from the trench, a mask alignment/exposure step is added and then ion implantation is performed, with the result that the number of manufacturing steps increases. Further, because ion implantation is performed through the trench, there are many parameters that may cause increase in fluctuations, such as a trench width, a trench depth, an insulating film thickness of the trench side wall, and an angle of the ion implantation, and hence it is extremely difficult to perform precise control. Fluctuations in the channel length of the transistor, fluctuations in a drain resistance layer, and further fluctuations in many transistor characteristics are thus unavoidable.

SUMMARY OF THE INVENTION

It is an object of the present invention to provide a method of manufacturing a trench MOSFET in which a depth of a P-body is changed by employing steps with good controllability and without increasing the number of manufacturing steps so much as Japanese Published Patent Application No. 2000-164869, and also provide a trench MOSFET manufactured by the method.

In order to achieve the above-mentioned object, the present invention employs the following measures.

A method of manufacturing a semiconductor device according to an aspect of the present invention includes: forming a buried layer of a second conductivity type on a semiconductor substrate of a first conductivity type; forming an epitaxial layer of the second conductivity type on the buried layer; forming a first diffusion layer region of the first conductivity type in the epitaxial layer of the second conductivity type; forming a deep trench region extending from the first diffusion layer region of the first conductivity type to inside of the epitaxial layer of the second conductivity type; forming a gate insulating film in an inner wall of the deep trench region; filling polysilicon into the deep trench region to be held in contact with the gate insulating film; forming a source region of the second conductivity type in a surface of the first diffusion layer region of the first conductivity type; performing ion implantation of impurities from the surface of the first diffusion layer region of the first conductivity type, to thereby form a second diffusion layer region of the first conductivity type; and forming a heavily doped diffusion layer of the first conductivity type in the surface of the first diffusion layer region of the first conductivity type, in which the forming of the second diffusion layer region of the first conductivity type is performed by performing ion implantation with an acceleration energy higher than an acceleration energy used during the forming of the first diffusion layer region of the first conductivity type.

A method of manufacturing a semiconductor device according to another aspect of the present invention includes: forming a buried layer of a second conductivity type on a semiconductor substrate of a first conductivity type; forming an epitaxial layer of the second conductivity type on the buried layer; forming a shallow trench region in a surface of the epitaxial layer of the second conductivity type; performing ion implantation from the surface of the epitaxial layer of the second conductivity type, to thereby form a diffusion layer region of the first conductivity type; forming a deep trench region extending from the diffusion layer region of the first conductivity type to inside of the epitaxial layer of the second conductivity type; forming a gate insulating film in an inner wall of the deep trench region; filling polysilicon into the deep trench region to be held in contact with the gate insulating film; forming a source region of the second conductivity type in a surface of the diffusion layer region of the first conductivity type; and forming a heavily doped diffusion layer of the first conductivity type in the surface of the diffusion layer region of the first conductivity type, in which the forming of the diffusion layer region of the first conductivity type is performed by performing ion implantation via the shallow trench region.

A semiconductor device according to still another aspect of the present invention includes: a semiconductor substrate of a first conductivity type; a buried layer of a second conductivity type, which becomes a heavily doped drain and is formed on the semiconductor substrate; an epitaxial layer of the second conductivity type, which becomes a lightly doped drain and is formed on the buried layer; a first diffusion layer region of the first conductivity type, which becomes a body region and is formed in the epitaxial layer of the second conductivity type; a deep trench region formed so as to be extended from the first diffusion layer region to inside of the epitaxial layer; a gate insulating film formed in an inner wall of the deep trench region; a gate electrode, which is made of polysilicon filled in the deep trench region and is held in contact with the gate insulating film; a source region of the second conductivity type, which is formed in a surface of the first diffusion layer region; and a heavily doped diffusion layer of the first conductivity type, which becomes a body contact region and is formed in the surface of the first diffusion layer region, in which the first diffusion layer region is shaped so as to include a second diffusion layer region at a bottom portion thereof and at a position distanced from the deep trench region, the second diffusion layer region extending toward the epitaxial layer.

According to the present invention, it is possible to manufacture, at low cost, a semiconductor device which has sufficient element characteristics and can meet a desired fine dimension.

DETAILED DESCRIPTION OF THE PREFERRED EMBODIMENTS

FIGS. 1A to 1C and 2A to 2C are views illustrating a method of manufacturing a semiconductor device according to a first embodiment of the present invention.

Manufacturing steps for a trench MOSFET according to the present invention are described in order along with the drawings.

Figure 1A:
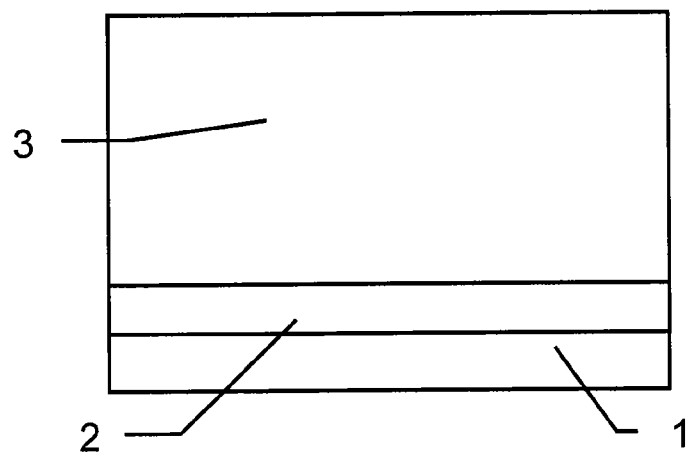
FIGS. 1A to 1C are cross-sectional views in order of the process, illustrating a method of manufacturing a semiconductor device according to a first embodiment of the present invention.

First, as illustrated in FIG. 1A, on an N+ type buried layer 2 formed on a P type semiconductor substrate 1, an epi layer 3 is provided, and the epi layer 3 is entirely doped with N type impurities (here, called as N-epi layer 3). The N+ type buried layer 2 is formed by doping of antimony (Sb), arsenic (As), or phosphorus (P) to have a concentration of $5 \times 10^{17}$ cm$^{-3}$ to $5 \times 10^{19}$ cm$^{-3}$. Further, the N-epi layer 3 is realized by doping of phosphorus to have a concentration of $1 \times 10^{15}$ cm$^{-3}$ to $5 \times 10^{17}$ cm$^{-3}$. The thicknesses of the N+ type buried layer 2 and the N-epi layer 3 are about 2 μm to 10 μm and 2 μm to 10 μm, respectively.

Then, shallow trench isolation (STI) for element isolation is formed in the N-epi layer 3, but the STI is not formed in a trench MOSFET region.

Figure 1B:
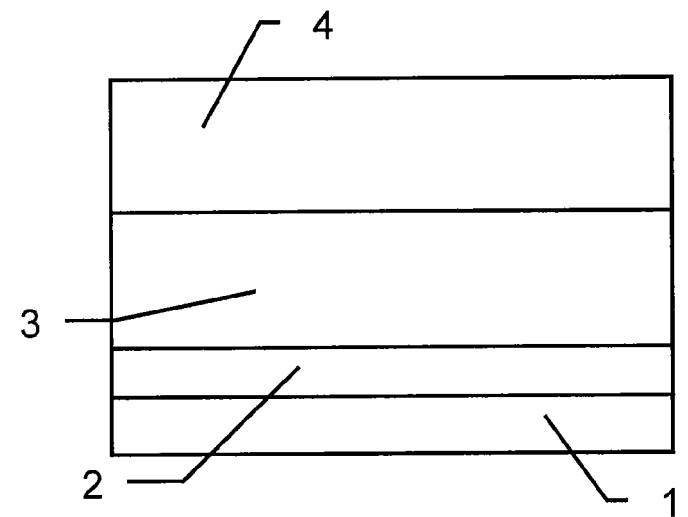

Next, as illustrated in FIG. 1B, a P-body 4 is formed by ion implantation. The P-body 4 is formed by implantation of boron (B) or boron difluoride (BF$_2$) so as to have a concentration of $5 \times 10^{16}$ cm$^{-3}$ to $1 \times 10^{18}$ cm$^{-3}$. The implantation acceleration energy at this time is changed depending on the breakdown voltage necessary for the trench MOSFET, but is preferably within the range of 50 keV to 250 keV.

Figure 1C:
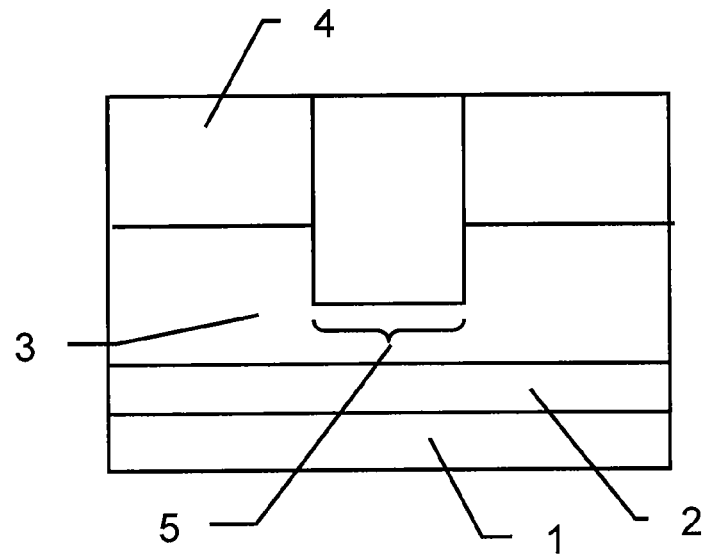

Further, as illustrated in FIG. 1C, a deep trench 5 is formed. The depth of the deep trench 5 is about 1 μm to 3 μm, and is appropriately chosen depending on the desired drain breakdown voltage of the transistor.

Figure 2A:
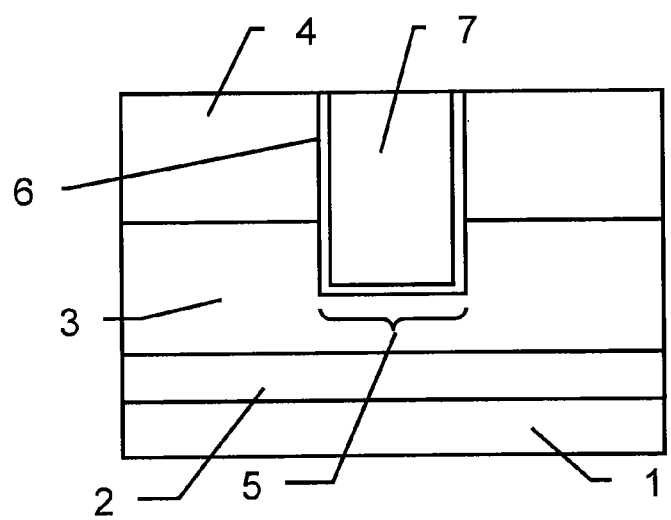
FIGS. 2A to 2C are cross-sectional views in order of the process, which follow the steps of FIGS. 1A to 1C.

Then, as illustrated in FIG. 2A, a gate oxide film 6 is formed in the inner wall of the deep trench 5 by thermal oxidation, and polysilicon as a gate electrode 7 is filled in the trench 5 inside of which is covered by the gate oxide film 6. The gate electrode 7 is electrically separated from the N-epi layer 3 and the P-body 4 by the gate oxide film 6 extending along the side wall and the bottom surface of the deep trench 5. The thickness of the gate oxide film 6 is selected in consideration of the desired gate breakdown voltage of the transistor, which is about 7 nm to 20 nm. Further, the formation temperature of the gate oxide film 6 is in the range of 800° C. to 1,150° C., and more preferably in the range of 1,000° C. to 1,150° C.

Figure 2B:
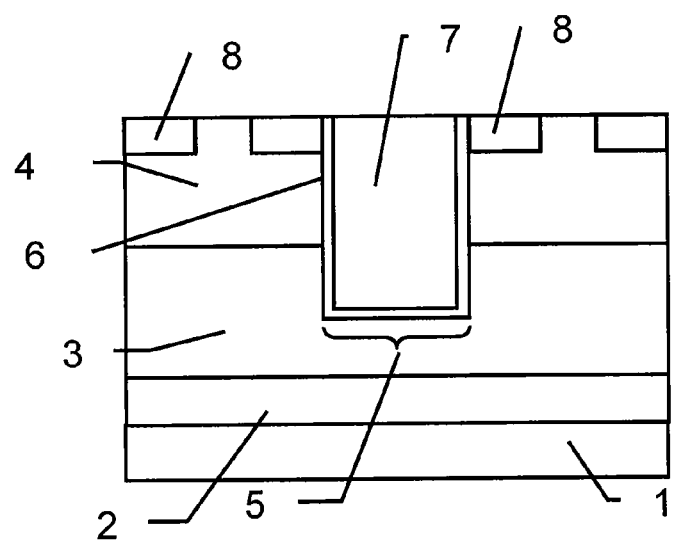

Subsequently, as illustrated in FIG. 2B, in the upper surface region of the P-body 4, ion implantation for forming an N+ type source heavily doped region 8 is performed. In order to form the N+ type source heavily doped region 8, for example, ion implantation of As is performed preferably at a dose of $5\times10^{14}$ atoms/cm$^2$ to $1\times10^{16}$ atoms/cm$^2$ so as to reduce the sheet resistance. As a matter of course, implantation of phosphorus (P) at high concentration may be alternatively performed.

Figure 2C:
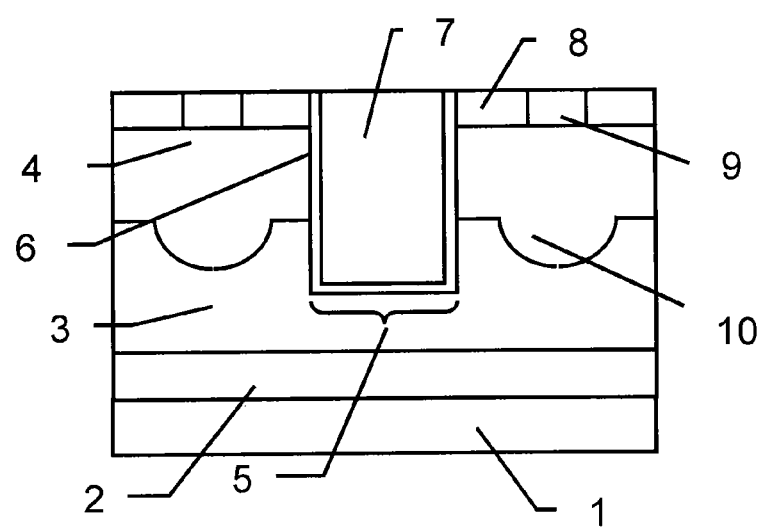

After that, as illustrated in FIG. 2C, a P+ body contact region 9 is formed by relatively low acceleration energy, and an extended P-body region 10 is formed by relatively high acceleration energy. Here, in order to form the P+ body contact region 9, for example, ion implantation of BF$_2$ is performed preferably at a dose of $5\times10^{14}$ atoms/cm$^2$ to $1\times10^{16}$ atoms/cm$^2$ so as to reduce the sheet resistance. As a matter of course, implantation of boron (B) at high concentration may be alternatively performed.

Subsequently, the extended P-body region 10 is formed so as to be continuous with the bottom portion of the P-body region which already exists, and is formed at a position at some distance from the deep trench 5. The extended P-body region 10 is formed by implantation of boron (B) or boron difluoride (BF$_2$) so as to have a concentration of $5\times10^{16}$ cm$^{-3}$ to $1\times10^{18}$ cm$^{-3}$. The implantation acceleration energy at this time is changed depending on the breakdown voltage necessary for the trench MOSFET, and is preferably within the range of 50 keV to 1,000 keV. Further, in the ion implantation at this time, the same mask pattern as that used in the ion implantation for forming the P+ body contact region 9 is used. After that, thermal treatment for activation and diffusion of the impurities used for the ion implantation is performed as necessary.

After that, a metal layer (not shown) is formed, to thereby form electrodes for the N+ type source heavily doped region 8 and the P-body 4.

In the above description, the case using the N-epi layer 3 is described, but a P-epi layer may be used to perform ion implantation of N type impurities simultaneously with to the P-body 4, and a region between the N+ type buried layer 2 and the P-body 4 may be set as an N type drain region. Further, description here is made on the premise of an N type transistor, but the present invention is applicable also in a case of a P type transistor having a buried layer and an epi layer of a P type and a P-body region of an N type. (As a matter of course, an epi layer of an N type may be used, and by impurity introduction, a region between the P type buried layer and the body region may be set as a P type drain region.)

Further, no description is given about a CMOS to be formed on the same substrate as the trench MOSFET, but the steps described above do not have any obstacles to the formation of the CMOS, and it is easy to form the trench MOSFET and the CMOS on the same substrate.

FIGS. 3A to 3C and 4A and 4B are views illustrating a method of manufacturing a semiconductor device according to a second embodiment of the present invention.

Figure 3A:
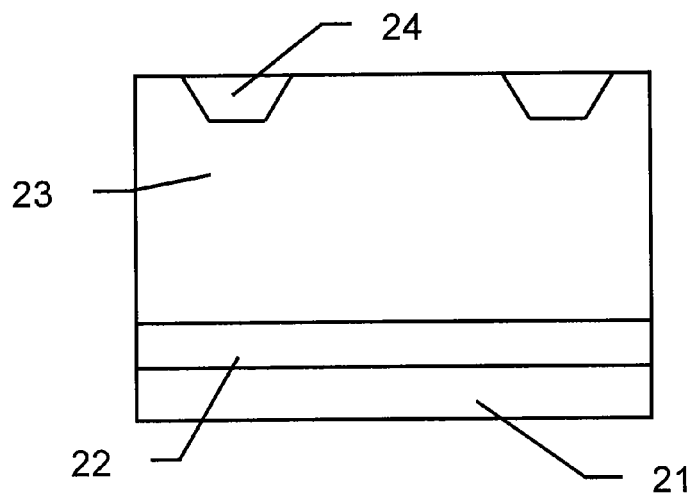
FIGS. 3A to 3C are cross-sectional views in order of the process, illustrating a method of manufacturing a semiconductor device according to a second embodiment of the present invention.

First, as illustrated in FIG. 3A, on an N+ type buried layer 22 formed on a P type semiconductor substrate 21, an epi layer 23 is provided, and the epi layer 23 is entirely doped with N type impurities (here, called as N-epi layer 23). The N+ type buried layer 22 is formed by being doped with antimony (Sb), arsenic (As), or phosphorus (P) to have a concentration of $5\times10^{17}$ cm$^{-3}$ to $5\times10^{19}$ cm$^{-3}$. Further, the N-epi layer 23 is realized by being doped with phosphorus to have a concentration of $1\times10^{15}$ cm$^{-3}$ to $5\times10^{17}$ cm$^{-3}$. The thicknesses of the N+ type buried layer 22 and the N-epi layer 23 are about 2 μm to 10 μm and 2 μm to 10 μm, respectively.

Next, an STI (called as shallow trench 24) for element isolation is formed in the N-epi layer 23, and an insulating film is filled in the shallow trench 24. After that, the insulating film in the shallow trench at the region in which the trench MOSFET is to be formed is removed. (This removal of the insulating film may be performed after a resist pattern for ion implantation to the P-body is formed afterwards.) Note that, the depth of the shallow trench is appropriately set depending on a generally required operation voltage, and is about 200 nm to 600 nm.

Figure 3B:
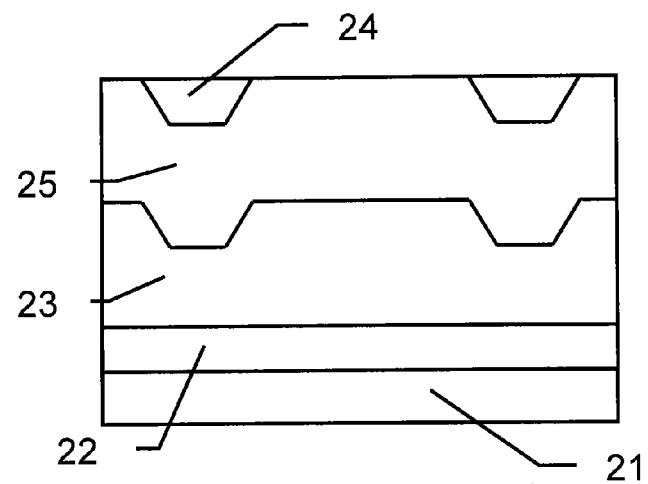

Further, as illustrated in FIG. 3B, a P-body 25 is formed by ion implantation. The P-body 25 is formed by implantation of boron (B) or boron difluoride (BF$_2$) so as to have a concentration of $5\times10^{16}$ cm$^{-3}$ to $1\times10^{18}$ cm$^{-3}$. At this time, at the region in which the shallow trench 24 with the insulating film inside being removed is formed, impurities are implanted deeper from the surface, and hence it is possible to form a deep P-body 25 directly below the shallow trench 24, and form a shallow P-body 25 in other regions. That is, it is possible to form the P-body 25 having an impurity distribution shape in the depth direction, which reflects the shape of the surface of the N-epi layer 23.

Figure 3C:
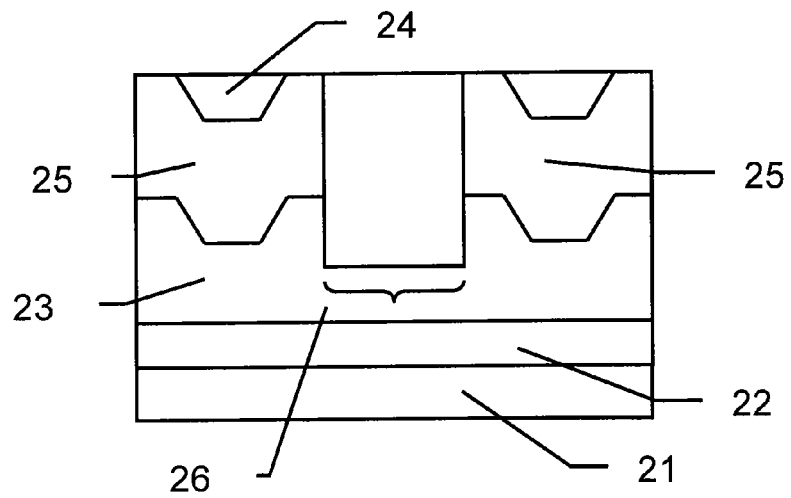

Then, as illustrated in FIG. 3C, a deep trench 26 is formed. The depth of the deep trench 26 is about 1 μm to 3 μm, and is appropriately set depending on the desired drain breakdown voltage of the transistor. It is important to set the deep trench 26 in the region where the P-body 25 is shallow.

Figure 4A:
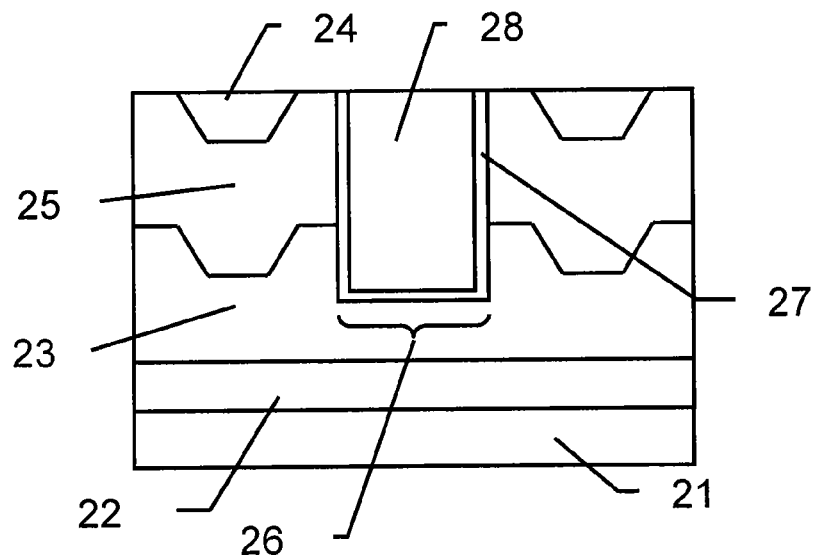
FIGS. 4A and 4B are cross-sectional views in order of the process, which follow the steps of FIGS. 3A to 3C.

Subsequently, as illustrated in FIG. 4A, a gate oxide film 27 is formed in the inner wall of the deep trench 26 by thermal oxidation, and polysilicon as a gate electrode 28 is filled in the trench 26 through intermediation of the gate oxide film 27. The gate electrode 28 is electrically separated from the N-epi layer 23 and the P-body 25 by the gate oxide film 27 extending along the side wall and the bottom surface of the deep trench 26. The thickness of the gate oxide film 27 is set in consideration of the desired gate breakdown voltage of the transistor, which is about 7 nm to 20 nm. Further, the formation temperature of the gate oxide film 27 is in the range of 800° C. to 1,150° C., and more preferably in the range of 1,000° C. to 1,150° C.

Figure 4B:
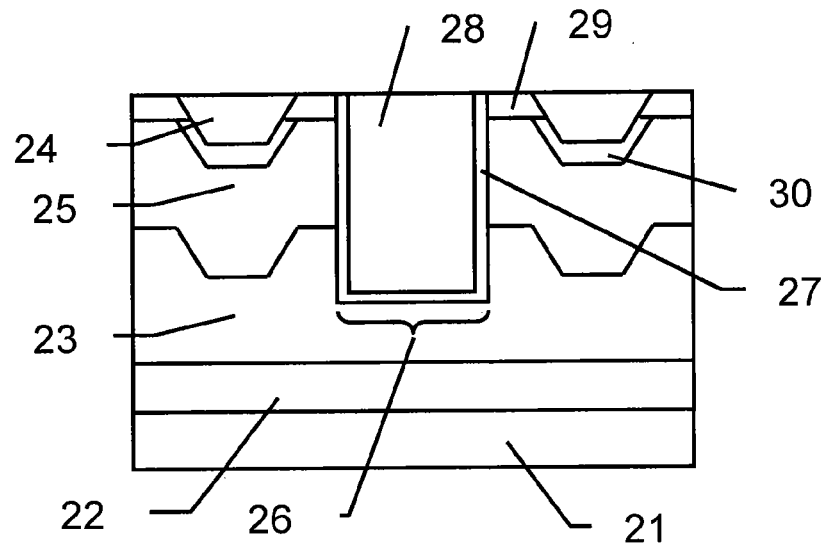
Figure 5:
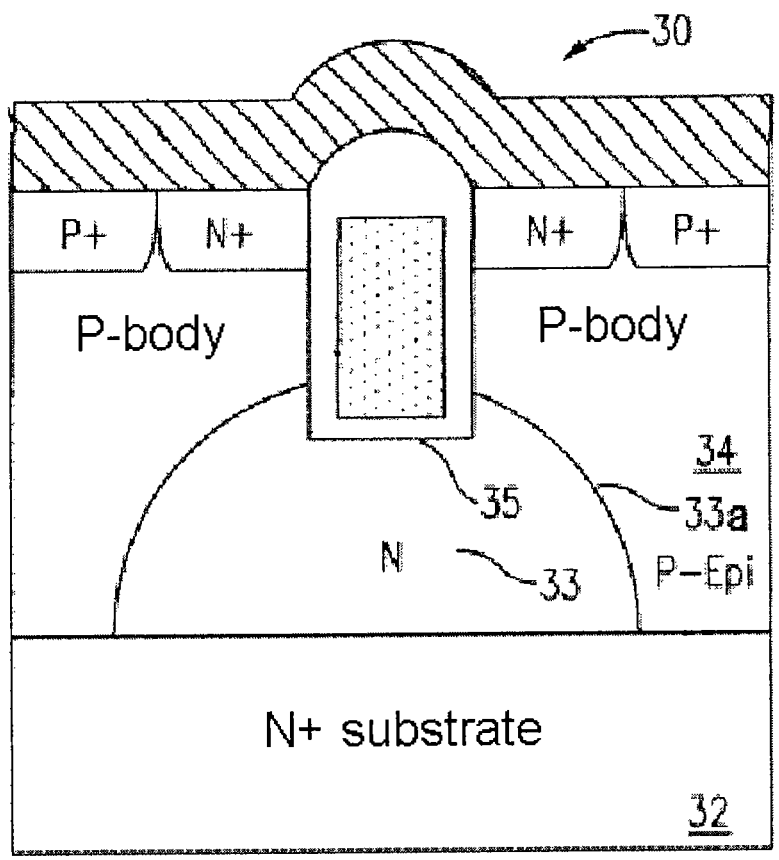
FIG. 5 is a view illustrating a conventional semiconductor device.

After that, as illustrated in FIG. 4B, in the upper surface of the P-body 25 and in a region of the shallow trench 24 adjacent to the side wall of the deep trench 26, an N+ source region 29 and a P+ body contact region 30 are formed.

In the above description, the case using the N-epi layer 23 is described, but a P-epi layer may be used to perform ion implantation of N type impurities simultaneously with to the P-body 25, and a region between the N+ type buried layer 22 and the P-body 25 may be set as an N type drain region. Further, description here is made on the premise of an N type transistor, but the present invention is applicable also in a case of a P type transistor having a buried layer and an epi layer of a P type and a P-body region of an N type. As a matter of course, an epi layer of an N type may be used, and by impurity introduction, a region between the P type buried layer and the body region may be set as a P type drain region.

Further, no description is given about a CMOS to be formed on the same substrate as the trench MOSFET, but the steps described above do not have any obstacles to the formation of the CMOS, and it is easy to form the trench MOSFET and the CMOS on the same substrate.

With the embodiments described above, the following effects may be obtained.

(1) With simple steps and without adding the mask step, a trench MOSFET having a high punch-through breakdown voltage can be formed.

(2) Few factors to cause fluctuations are present, and hence it is possible to manufacture a device with stable quality.

(3) It is possible to improve the punch-through breakdown voltage while maintaining the channel length short, and hence it is possible to realize a trench MOSFET having high current driving performance of the transistor.

The present invention is applicable to a semiconductor device used in an automobile, or a semiconductor device which may be effectively applied to electrical home appliances such as a TV, a DVD, and major appliances, which require relatively high breakdown voltage and high driving performance.

What is claimed is:

1. A semiconductor device, comprising:
    a semiconductor substrate of a first conductivity type;
    a buried layer of a second conductivity type on the semiconductor substrate;
    an epitaxial layer of the second conductivity type on the buried layer and having a shallow trench region in a surface thereof;
    a first diffusion layer region of the first conductivity type in the epitaxial layer of the second conductivity type;
    a deep trench region extending from the first diffusion layer region in the epitaxial layer;
    a gate insulating film on an inner wall of the deep trench region;
    a gate electrode comprising polysilicon in the deep trench region and in contact with the gate insulating film;
    a source region of the second conductivity type in a surface of the first diffusion layer region; and
    a heavily doped diffusion layer of the first conductivity type in the surface of the first diffusion layer region,
    wherein the first diffusion layer region is shaped so as to include a second diffusion layer region at a bottom portion thereof and at a position spaced away from the deep trench region, the second diffusion layer region extending in the epitaxial layer below the shallow trench region, and
    wherein the buried layer comprises a heavily doped drain, the epitaxial layer comprises a lightly doped drain, the first diffusion layer region comprise a body region, and the heavily doped diffusion layer comprises a body contact region.

2. A semiconductor device according to claim 1, wherein the second diffusion layer region resides below the body contact region.

* * * * *